United States Patent [19]
Beutler

[11] 3,943,378
[45] Mar. 9, 1976

[54] CMOS SYNCHRONOUS BINARY COUNTER

[75] Inventor: Robert Russel Beutler, Tempe, Ariz.

[73] Assignee: Motorola, Inc., Chicago, Ill.

[22] Filed: Aug. 1, 1974

[21] Appl. No.: 493,575

[52] U.S. Cl.......... 307/224 C; 307/225 C; 307/251; 328/51
[51] Int. Cl.² .................. H03K 21/16; H03K 23/22; H03K 23/24
[58] Field of Search ........ 307/220 R, 220 C, 224 R, 307/224 C, 225 R, 225 C, 251; 328/42, 51

[56] References Cited
UNITED STATES PATENTS

| | | | |
|---|---|---|---|
| 2,853,238 | 9/1958 | Johnson | 307/225 R |
| 3,548,319 | 12/1970 | Price | 307/224 X |
| 3,631,350 | 12/1971 | Drake | 328/42 |
| 3,679,913 | 7/1972 | Foltz | 307/225 C X |
| 3,784,918 | 1/1974 | Fassbender | 328/51 X |

OTHER PUBLICATIONS

Wenniger, "Speed Your Multi-Stage Counter Designs"; *Electronic Design;* 8/15/1968; pp. 212–216.

Primary Examiner—Stanley D. Miller, Jr.
Assistant Examiner—L. N. Anagnos
Attorney, Agent, or Firm—Harry M. Weiss; Charles R. Hoffman

[57] ABSTRACT

A multi-state CMOS synchronous binary counter is implemented utilizing a CMOS transmission gate look-ahead carry circuit requiring only a fraction of the area required for AND or NAND gate carry structures.

5 Claims, 2 Drawing Figures

CMOS SYNCHRONOUS BINARY COUNTER

BACKGROUND OF THE INVENTION

Binary ripple-type counter are well known and have been implemented utilizing CMOS technologies. However, the disadvantage of binary ripple carry type counters is that the input clock pulse must ripple through each flip-flop stage of the binary counter. A typical CMOS flip-flop propagation delay is of the order of 60 nanoseconds. Therefore, as an example, in a 24-state counter, the time required for the clock information to reach the last stage output is of the order of 1.5 microseconds. A synchronous counter would in many applications be much more desirable because the total counter clock to output propagation delay would never exceed one flip-flop propagation delay. However, for many state counters, this has not been attempted using CMOS technology because the die area required to implement a binary synchronous counter has been excessive.

Synchronous CMOS binary counters having a small number of stages have been manufactured. However, AND or NAND gates have been required to perform the look-ahead carry function that is required. However, the number of inputs required on each input NAND gate which is required for each state of the counter increases by one for each stage of the counter. Implementation of AND or NAND gates in the CMOS technology quickly becomes impractical to implement because the amount of die area required therefor multiplies rapidly as the number of inputs increases. A conventional binary counter having an AND gate at the input of each counter stage which indicates when logical "1"s are stored in previous counter stages is described in U.S. Pat. No. 3,422,254, inventor S. J. R. Lundin.

SUMMARY OF THE INVENTION

A binary counter includes a plurality of divider stages. Each of the divider stages is coupled to a following divider stage, except that the last stage is coupled to an output of said binary counter. The first divider stage has an output coupled directly to the input of the second divider stage. Each divider stage includes a flip flop. Each divider stage except the input divider stage includes a CMOS transmission gate including a P-Channel MOSFET and and N-Channel MOSFET coupled in parallel and having a gate electrode coupled to a separate one of the outputs, respectively, of the particular divider stage. One main terminal of each transmission gate is coupled to the toggle input of the associated divider stage. The other main terminal of each CMOS transmission gate is connected to a first node. A discharge MOSFET is connected between each said first node and a ground conductor and has its gate coupled to an output of the associated divider stage. A fast, low area AND function is thereby implemented which indicates when a state of a preceding divider stage is at a logical "1" at said first node.

It is an object of this invention to provide a binary CMOS counter having simplified look-ahead carry circuit means.

It is another object of the invention to provide a CMOS binary counter with look-ahead carry means implemented by means of a single CMOS transmission gate associated with each divider stage except an input divider stage.

DESCRIPTION OF THE INVENTION

Figures 1, 2:
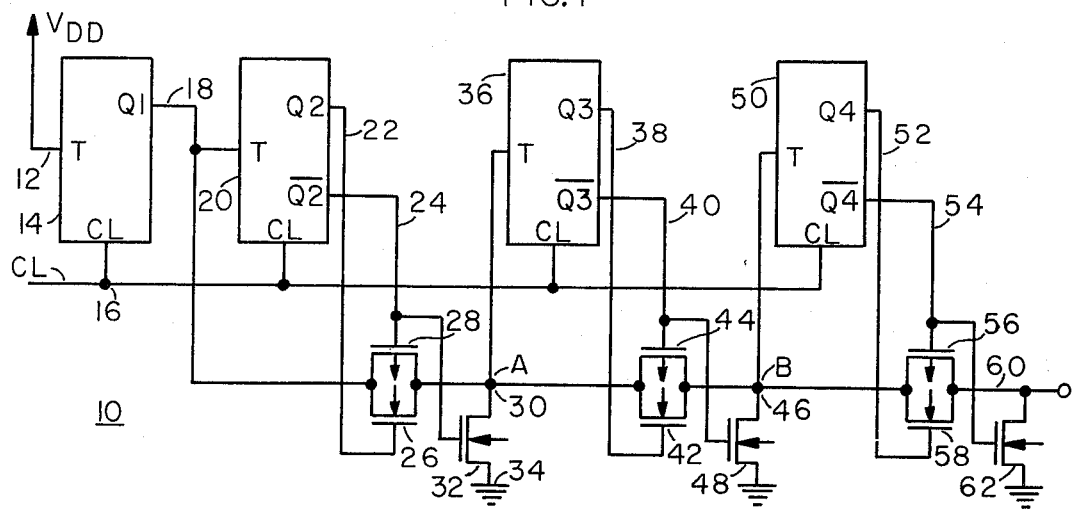
FIG. 1 is a schematic diagram of a four-stage CMOS synchronous binary counter embodying the transmission data carry structure according to the invention.
FIG. 2 is a timing diagram illustrating waveforms in the circuit of FIG. 1 and is useful in describing the operation of the invention.

Referring to FIG. 1 of the drawings, CMOS synchronous binary counter 10 includes four toggle flip-flops 14, 20, 36 and 50. Each of the flip-flops includes a Q output, a $\overline{Q}$ output, a clock input $C_L$, and a toggle input T. A clock conductor 16 has a clock signal applied thereto and is connected to the clock input $C_L$ of each of the flip-flops. Input flip-flop 14 has its T input connected to $V_{DD}$ conductor 12 and has it Q output Q1 connected to node 18, which is also connected to the T input of second flip-flop 20.

The flip-flops used in FIG. 1 are of the type wherein if the T input is a logical "1", the flip-flop will change state when a positive clock transition occurs. The flip-flop will not change state if the T input is a logical "0".

The Q output of flip-flop 20, Q2, is connected to node 22 and a $\overline{Q}$ output is connected to node 24. A CMOS transmission gate including P-Channel MOSFET 28 and N-Channel MOSFET 26 is coupled between node 18 and node 30. A CMOS transmission gate consists of a P-Channel MOSFET and an N-Channel MOSFET connected in parallel. It may be considered as having two main electrodes, which function as the sources and drains of the P and N-Channel MOSFETs. (Whether a particular main electrode is functioning as a source or a drain depends on the relative voltages, as is known to those skilled in the art. For a P-Channel MOSFET, the main electrode with the higher voltage is the source and for the N-Channel MOSFET the main electrode with the lower voltage is the source). A gate of P-Channel MOSFET 28 is connected to node 24. The gate electrode of MOSFET 26 is connected to node 22, and one main electrode of the CMOS transmission gate is connected to node 18 and the other main electrode is connected to node 30. Discharge MOSFET 32 is an N-Channel MOSFET having its drain connected to node 30 and its source connected to ground conductor 34 and having its gate electrode connected to node 24.

A second CMOS transmission gate including P-Channel MOSFET 44 and N-Channel MOSFET 42 connected in parallel therewith has one main electrode connected to node 30, also designated by the letter A and another main electrode connected to node 46, also designated by Letter B. The gate of P-Channel MOSFET 44 is connected to node 40, which is also connected to $\overline{Q}$ output Q3 of flip-flop 36. N-Channel MOSFET 42 has a gate electrode connected to node 38 which is also connected to Q output Q3 of flip-flop 36. N-Channel MOSFET 48 is connected between node 46 and ground conductor 34 and has its gate connected to node 40. Flip-flop 36 has its T input connected to node 30.

Flip-flop 50 has its Q output Q4 connected to node 52 and its $\overline{Q}$ output $\overline{Q4}$ connected to node 54 and has its toggle input T connected to node 46. A third CMOS transmission gate including P-Channel MOSFET 56 and N-Channel MOSFET 58 has one main electrode connected to node 46 and another main electrode connected to output node 60. The gate of P-Channel MOSFET 56 is connected to node 54 and the gate of N-Channel MOSFET 58 is connected to node 52. N-Channel MOSFET 62 is connected between output node 60 and ground conductor 34 and has its gate connected to node 54.

It is seen that the transmission gate including P-Channel MOSFET 28 and N-Channel MOSFET 26 functions, in conjunction with N-Channel MOSFET 32, as a two-input AND gate having node 18 as one input and node 22 as the other input. The complementary signal on node 24 turns P-Channel MOSFET 28 on and off at the same time that N-Channel MOSFET 26 is turned on and off, and also turns on N-Channel MOSFET 32 when a logical "0" is stored in flip-flop 20. Node 30 is the output of the above mentioned AND gate. The CMOS transmission gate including P-Channel MOSFET 44 and N-Channel MOSFET 42 similarly acts as a two-input AND gate having one input connected to the output 30 of the above-described AND gate and the other input connected to Q3 of flip-flop 36.

Thus, a logical "1" will appear at node B only when there is a logical "1" on node 18, on node 22, and on node 38. The CMOS transmission gate including MOSFETS 56 and 58 function similarly.

It is seen, with reference to FIG. 1 and also the timing diagram of FIG. 2, a logical "1" will appear at the output of each transmission gate only if a logical "1" is stored in the flip-flop whose outputs are connected to the gate electrodes of the transmission gate and also if the output of the preceding (less significant) flip-flop is also at a logical "1". Referring to FIG. 2, at transition C of $C_L$, the T input of flip-flop 14 is high, being tied to $V_{DD}$. Therefore, after one propagation delay, Q1 changes from a "1" to a "0" at transition D. As is seen from the $C_L$ waveform and the Q1 waveform, flip-flop 14 divides the frequency of $C_L$ by a factor of 2. Referring to waveform Q2, it is seen that in response to transition C of $C_L$, Q2 undergoes transition E, Waveform A also undergoes transition F, following Q1, since both Q1 and Q2 were at a logical "1" at transition C.

For example, if flip-flop stages 14, 20 and 36 are at a logical "1" CMOS transmission gates 26, 28 and 42, 44 are in the conducting state. Therefore, the logical "1" at Q1, node 18, will be applied to the T input of flip-flops 20, 36 and 50. Therefore, with the occurrence of a positive transition of $C_L$, flip-flops 14, 20 and 36 will change to a "0" and flip-flop 50 will change to a logical "1".

While the invention has been described in relation to a preferred embodiment thereof, those skilled in the art will recognize that variation in arrangement and placement of parts may be made to satisfy varying requirements within the scope and spirit of the invention.

What is claimed is:

1. A binary counter comprising a plurality of sequentially coupled divider stages with each stage having a first and second output terminal and further including a plurality of CMOS transmission gate means each coupled to an input terminal and to said first output terminal of a single one of said divider stages of said plurality of stages and coupled to an input terminal of a following one of said plurality of divider stages for providing a logical AND function in response to an input signal at said input terminal of said respective single divider stage and an output signal at said first output terminal of said respective single divider stage wherein each of said transmission gate means includes a P-channel MOSFET and an N-channel MOSFET coupled in parallel between the input terminal of said respective single divider stage and the input terminal of said following divider stage, the respective gate electrodes of each of said MOSFETs being coupled to a respective one of said first and second output terminals of said respective divider stages, wherein said output terminals of each of said respective single divider stages produce complementary logic output signals.

2. The binary counter as recited in claim 1 wherein a discharge MOSFET is coupled between said input of said following divider stage and a reference voltage conductor and has a gate electrode coupled to said second output of said divider stage.

3. The binary counter as recited in claim 2 wherein each of said plurality of divider stages except a first stage has CMOS transmission gate means coupled thereto.

4. A binary counter including an input flip-flop stage having a toggle input, a clock input, and a Q output, and a plurality of other flip-flop stages, each having a toggle input, a clock input, a Q output and a $\overline{Q}$ output, each of said flip-flops having its clock input coupled to a clock conductor adapted for having a clock signal applied thereto, each of said plurality of flip-flop stages having coupled thereto a CMOS transmission gate having a first and second main electrode and including a P-Channel MOSFET and an N-Channel MOSFET coupled in parallel and a discharge MOSFET, said P-Channel MOSFET having a gate electrode coupled to said $\overline{Q}$ output of said flip-flop and each N-Channel MOSFET having a gate electrode coupled to said Q output of said flip-flop and each discharge MOSFET having a gate electrode coupled to said $\overline{Q}$ output of said flip-flop, said first main electrode of each CMOS transmission gate being coupled to said toggle input of said flip-flop and said second main electrode coupled to a first node, each said first node being coupled to said toggle input of a following flip-flop except said first node of a last flip-flop which is coupled to an output of said binary counter.

5. The binary counter as recited in claim 4 wherein said flip-flops are of a type which change state on a positive edge of a clock signal applied to said clock conductor.

* * * * *